(12) United States Patent
Koopmans (10) Patent No.: US 6,943,094 B2
(45) Date of Patent: *Sep. 13, 2005

(54) METHOD FOR ATTACHING SEMICONDUCTOR COMPONENTS TO A SUBSTRATE USING COMPONENT ATTACH SYSTEM HAVING RADIATION EXPOSURE ASSEMBLY

(75) Inventor: Michel Koopmans, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/456,274

(22) Filed: Jun. 6, 2003

(65) Prior Publication Data

US 2003/0207497 A1 Nov. 6, 2003

Related U.S. Application Data

(63) Continuation of application No. 09/906,324, filed on Jul. 16, 2001, now Pat. No. 6,589,809.

(51) Int. Cl.[7] .................. H01L 21/46; H01L 21/78; H01L 21/301
(52) U.S. Cl. .................. 438/462; 438/463; 438/464
(58) Field of Search ................. 438/462, 463, 438/464, 68, 113, 114, 458

(56) References Cited

U.S. PATENT DOCUMENTS

| | | | | |
|---|---|---|---|---|
| 3,991,296 A | * | 11/1976 | Kojima et al. | 219/121.68 |
| 4,296,542 A | * | 10/1981 | Gotman | 438/17 |
| 5,098,501 A | * | 3/1992 | Nishiguchi | 156/275.5 |
| 5,187,007 A | * | 2/1993 | Ebe et al. | 428/343 |
| 5,238,876 A | | 8/1993 | Takeuchi et al. | |
| 5,304,418 A | | 4/1994 | Akada et al. | |

(Continued)

Primary Examiner—W. David Coleman
Assistant Examiner—Khiem Nguyen
(74) Attorney, Agent, or Firm—Stephen A. Gratton (57) ABSTRACT

A method and a system for attaching semiconductor components to a substrate are provided. In the illustrative embodiment the substrate is a leadframe, and the components are semiconductor dice or packages contained on a component substrate such as a wafer. The method includes the steps of holding and dicing the component substrate using a radiation sensitive tape. The method also includes the steps of providing a component attach system having a radiation curing system, and then performing local curing of the dicing tape during a component attach step using the component attach system. The system includes the component attach system which includes a stepper mechanism for stepping the component substrate, and a component attach mechanism having an ejector pin for pushing the components one at a time from the tape and a pick and place mechanism for placing the components on the substrate. The component attach mechanism also includes a housing having a contact surface for physically engaging the dicing tape, and an opening having an outline matching that of a singulated component.

21 Claims, 5 Drawing Sheets

U.S. PATENT DOCUMENTS

| | | | |
|---|---|---|---|
| 5,310,410 A | 5/1994 | Begin et al. | |
| 5,447,266 A | 9/1995 | Misono | |
| 5,534,102 A | 7/1996 | Kadono et al. | |
| 5,622,900 A | 4/1997 | Smith | |
| 5,670,260 A | 9/1997 | Zajaczkowski et al. | |
| 5,827,394 A * | 10/1998 | Lu | 156/344 |
| 5,851,664 A | 12/1998 | Bennett et al. | |
| 5,888,883 A * | 3/1999 | Sasaki et al. | 438/460 |
| 5,904,546 A | 5/1999 | Wood et al. | |
| 5,952,725 A | 9/1999 | Ball | |
| 5,981,391 A | 11/1999 | Yamada | |
| 6,012,502 A | 1/2000 | VanNortwick et al. | |
| 6,017,776 A | 1/2000 | Jiang et al. | |
| 6,140,151 A | 10/2000 | Akram | |
| 6,184,109 B1 * | 2/2001 | Sasaki et al. | 438/464 |
| 6,191,774 B1 | 2/2001 | Schena et al. | |
| 6,200,833 B1 | 3/2001 | Jiang et al. | |
| 6,201,306 B1 | 3/2001 | Kurosawa et al. | |
| 6,319,754 B1 * | 11/2001 | Wang et al. | 438/113 |
| 6,420,211 B1 * | 7/2002 | Brunet et al. | 438/113 |
| 6,543,513 B1 | 4/2003 | Lau et al. | |
| 6,589,809 B1 | 7/2003 | Koopmans | |
| 6,827,636 B2 * | 12/2004 | Yamada | 451/65 |
| 2001/0000079 A1 * | 3/2001 | Usami et al. | 438/119 |
| 2002/0066869 A1 * | 6/2002 | Nguyen | 250/492.1 |
| 2002/0192569 A1 | 12/2002 | Ulland et al. | |
| 2003/0191397 A1 | 10/2003 | Webb | |
| 2003/0201522 A1 * | 10/2003 | Usami | 257/678 |

\* cited by examiner

METHOD FOR ATTACHING SEMICONDUCTOR COMPONENTS TO A SUBSTRATE USING COMPONENT ATTACH SYSTEM HAVING RADIATION EXPOSURE ASSEMBLY

CROSS REFERENCE TO RELATED APPLICATIONS

This application is a continuation of Ser. No. 09/906,324, filed Jul. 16, 2001, U.S. Pat. No. 6,589,809 B1. This application is related to Ser. No. 10/157,723, filed May 28, 2002.

FIELD OF THE INVENTION

This invention relates generally to semiconductor manufacture, and more particularly to a method and system for attaching semiconductor components, such as dice and packages, to a substrate, such as a leadframe or panel, in which a dicing tape for the dice is locally cured using radiation.

BACKGROUND OF THE INVENTION

One well known semiconductor processing step involves dicing a semiconductor wafer into singulated components. Typically the wafer includes a plurality of semiconductor dice or semiconductor packages, which are referred to herein as "semiconductor components".

One technique for dicing a wafer is saw cutting. With saw cutting, the wafer is mounted to a support member, and a diamond tipped saw rotating at high rpms saws the wafer along pre-formed lines known as streets. Another technique for dicing a wafer is scribing. With scribing, the wafer is again mounted to a support member, scribed along the streets, and then broken along the scribe lines by application of pressure exerted through a roller or other mechanism.

One conventional support member for dicing a wafer is known as a film frame. The film frame includes a metal frame, and an adhesive dicing tape stretched across the metal frame. The dicing tape can comprise a polymer film having an adhesive on one or both sides or a polymer layer having adhesive qualities. The dicing tape is formulated to provide a high adhesion with the wafer in order to prevent the wafer, and the singulated components, from moving during the dicing process. The high adhesion of the dicing tape is also advantageous for transporting the singulated components on the film frame for further processing, such as packaging.

However, the high adhesion of the dicing tape is a disadvantage when the singulated components must be removed from the tape. For example, mechanisms such as pushers and vacuum picks are utilized to either push or pull the singulated components from the dicing tape. These mechanisms are hampered by the high adhesion of the dicing tape, which must be overcome to separate the singulated components from the tape.

One prior art approach for reducing the adhesion of the dicing tape, is to construct the tape using an adhesive that is sensitive to a radiation, such as ultraviolet radiation. With a radiation sensitive dicing tape, exposure of the back side of the tape to the radiation reduces the adhesion of the tape, allowing the singulated components to be more easily separated from the tape. Typically, the entire backside of the dicing tape is exposed to the radiation, and adhesion of the tape can be reduced by a factor of ten or more.

One shortcoming of this approach is that not all of the singulated components are removed from the dicing tape at the same time. For example, semiconductor components are often graded according to speed, and the premium components are utilized in some products, while the non-premium components are utilized in other products. The premium components may thus be removed from the dicing tape for processing prior to the non-premium components (or vice versa). However, if all of the dicing tape has been exposed to radiation, the non-premium components remaining on the tape may not be secured for further transport. Accordingly, these components can move, or separate entirely from the dicing tape. This movement and separation can chip and damage the dice and cause problems in handling and in subsequent processing steps.

Another prior art approach for processing singulated components is disclosed in U.S. Pat. No. 6,140,151 to Akram. This approach involves exposing only selected portions of the dicing tape to radiation. For example, the selected portions can be adjacent to the premium components, permitting these components to be easily removed, while the non-premium components remain attached to the tape. With this technique a mask and a wafer stepper can be used to expose only selected portions of the dicing tape. One shortcoming of this technique is that additional equipment (e.g. mask, stepper), and an additional process step are required to expose the dicing tape.

The present invention is directed to a method and system for attaching semiconductor components to substrates, in which radiation curing of the dicing tape is incorporated into a component attach process. In addition, the present invention incorporates a radiation curing system into the component attach system, and performs the curing step simultaneously with a component attach step.

SUMMARY OF THE INVENTION

In accordance with the present invention, an improved method and system for attaching semiconductor components to a substrate, are provided. In the illustrative embodiment the components comprise semiconductor dice or packages, and the substrate comprises a leadframe or a panel. In addition, the components are initially contained on a component substrate, which in the illustrative embodiment comprises a semiconductor wafer or portion thereof.

The method includes the steps of providing a support member having a radiation sensitive dicing tape thereon, mounting a component substrate to the dicing tape, and then dicing the component substrate on the dicing tape into singulated components. The dicing step can be performed using any suitable process, such as sawing, scribing etching or water jetting. The method also includes the step of providing a component attach system configured to attach adhesive members to the substrate, and then to attach the singulated components to the adhesive members.

In the illustrative embodiment, the component attach system includes a component attach mechanism, and a stepper mechanism configured to step the support member in x and y directions, such that a single component on the dicing tape is aligned with the component attach mechanism. The component attach mechanism includes a housing having a contact surface with vacuum openings for holding the dicing tape, and an opening having an outline that matches the outline of a singulated component. The component attach mechanism also includes a source of radiation (e.g., UV radiation), a fiber optic cable in communication with the source, and a lens on the fiber optic cable. The lens is configured to direct the radiation through the opening in the housing, and onto the backside of the dicing tape.

The component attach mechanism also includes an ejector pin configured to move through the opening, and to push the singulated component from the support member. In addition, the component attach mechanism includes a vacuum pick and place mechanism configured to pick up the component as it is pushed from the support member, and then to place the component on substrate.

During the component attach step the stepper mechanism moves the support member in x and y directions, to align a selected component on the dicing tape to the component attach mechanism. The component attach mechanism is then moved such that the opening in the housing aligns with the backside of the component, with the contact surface and the vacuum openings on the housing in contact with the backside of the dicing tape adjacent to the component. With the component attach mechanism aligned with the component, the radiation source is actuated to direct the radiation through the lens, through the opening in the housing, and onto the backside of the dicing tape. This locally cures the dicing tape in the area adjacent to the backside of the component, such that the tape loses its adhesiveness in this area. Prior to, or simultaneously with the component attach step, the substrate with the adhesive members thereon, is indexed into a position proximate to the component. The ejector pin is then actuated to push the component off the dicing tape, as the pick and place mechanism simultaneously picks and places the component on the substrate.

The system includes the support member and the radiation sensitive dicing tape for holding the diced components on the support member. The system also includes the component attach system which is configured to attach adhesive members to the substrate, and to attach the components to the adhesive members. The component attach system includes the component attach mechanism which comprises the housing with the opening corresponding to the outline of the component, the flexible fiber optic cable, the lens and the ejector pin.

DETAILED DESCRIPTION OF THE PREFERRED EMBODIMENTS

As used herein the term "semiconductor component" refers to an element that includes one or more semiconductor dice. Exemplary semiconductor components include bare semiconductor dice, bumped semiconductor dice, semiconductor packages, and chip scale packages.

The term "substrate" refers to an element configured to support one or more semiconductor components. Exemplary substrates includes metal leadframes, organic leadframes, ceramic or silicon plates, glass resin panels, and printed circuit boards.

The term "component substrate" refers to an element that includes a plurality of semiconductor components. Exemplary component substrates include semiconductor wafers containing dice or packages, portions of semiconductor wafers, and panels containing semiconductor packages.

The term "tape" refers to an element that includes a polymer substrate and at least one adhesive surface. Exemplary tapes include a polymer film such as polyethylene, polypropylene, polyester, or polycarbonate, having an adhesive such as an acrylic polymer on one or both sides. The polymer substrate rather than being a film can also comprise a deposited polymer layer having adhesive qualities. In this case the polymer layer can comprise a material such as polyimide or epoxy in a "cured" or "uncured" condition.

The term "radiation sensitive tape" refers to a tape as defined above, in which at least one adhesive surface thereof has reduced adhesiveness when exposed to a radiation such as ultraviolet, infrared, thermal or radioactive.

Figure 1:
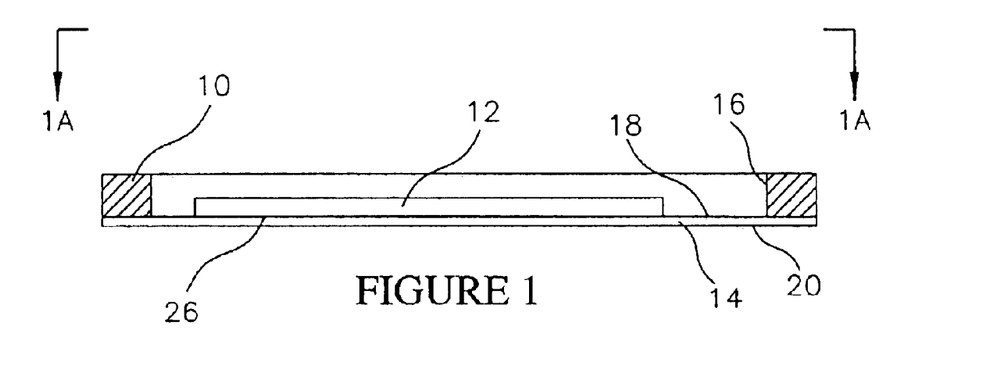
FIG. 1 is a schematic cross sectional view of a component substrate mounted to dicing tape on a support member.
Figure 1A:
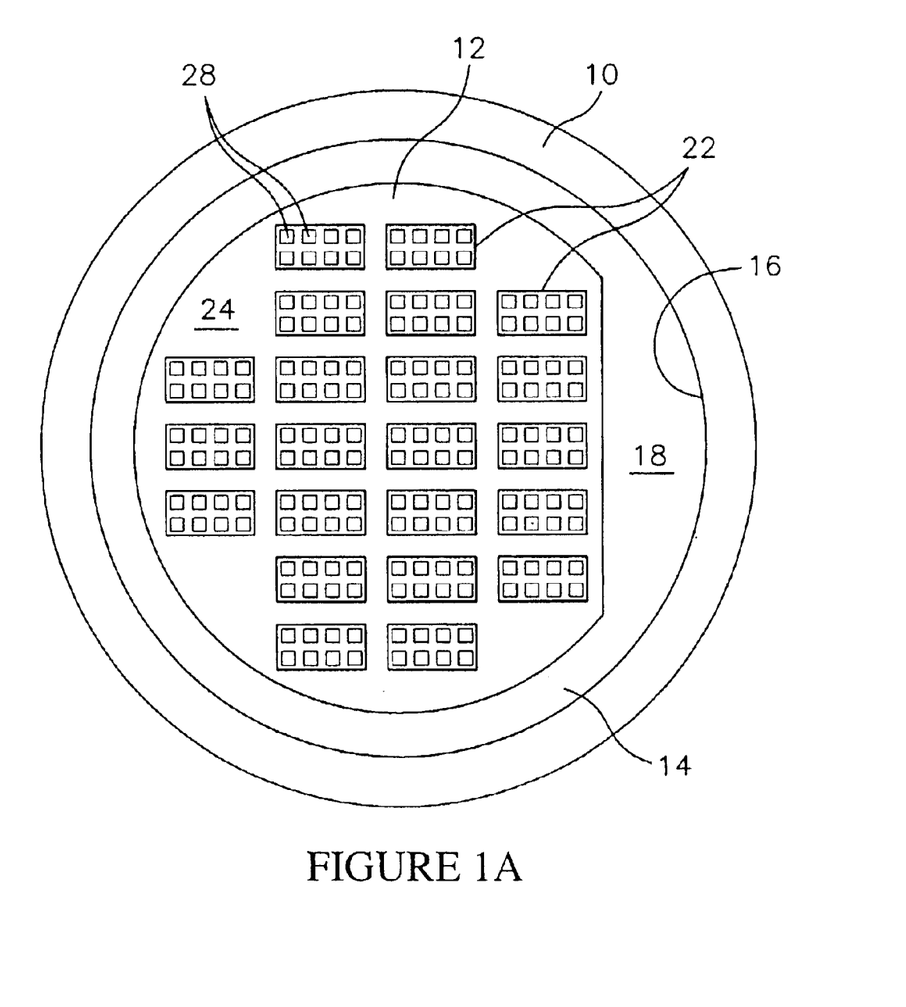
FIG. 1A is a plan view taken along line 1A—1A of FIG. 1 illustrating the component substrate and the support member.

Referring to FIGS. 1 and 1A, a step in a method for attaching semiconductor components to a substrate in accordance with the invention is illustrated. As an initial step, a support member 10 is provided. The support member 10 is a generally circular shaped, metal frame configured to hold a component substrate 12 for dicing and transport. In addition, the support member 10 can comprise a conventional film frame, manufactured by any one of a variety of different manufacturers.

The support member 10 includes a circular opening 16 and a radiation sensitive dicing tape 14 stretched across the opening 16. The dicing tape 14 comprises a polymer substrate having an adhesive surface 18 for holding the component substrate 12, and an opposing backside surface 20. The backside surface 20 of the dicing tape 14 can be either adhesive or non-adhesive as required for a particular application. The adhesive surface 18 of the dicing tape 14 includes an adhesive formulated to have reduced adhesiveness upon exposure to a radiation such as UV radiation. As the radiation is transmitted through the backside surface 20 to the adhesive surface 18, the polymer substrate of the dicing tape 14 must also be transparent to the radiation.

Suitable adhesive tapes for forming the radiation sensitive dicing tape 14 are disclosed in U.S. Pat. No. 5,851,664 to Bennett et al; U.S. Pat. No. 5,670,260 to Zajaczkowski et al; and U.S. Pat. No. 5,304,418 to Akada et al. In addition, radiation sensitive tapes are commercially available from Minnesota Mining and Manufacturing Company, St. Paul, Minn.; and Furukawa Electric Company, Ltd. of Japan.

As shown in FIG. 1A, the component substrate 12 includes a plurality of semiconductor components 22. In the illustrative embodiment the component substrate 12 comprises a semiconductor wafer, and the semiconductor components 22 comprise semiconductor dice or packages contained on the wafer. The component substrate 12 includes a circuit side 24 (face) and a backside 26 (FIG. 1). The circuit side 24 is exposed, and the backside 26 is in physical contact with the dicing tape 14. Each component 22 on the component substrate 12 includes a plurality of external contacts 28, such as planar bond pads as shown, metal bumps or solder balls.

Figure 2:
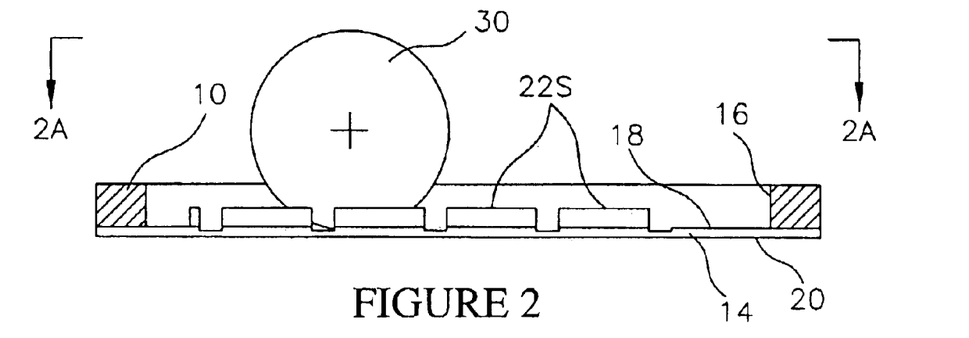
FIG. 2 is a schematic cross sectional view illustrating dicing of the component substrate using a saw.
Figure 2A:
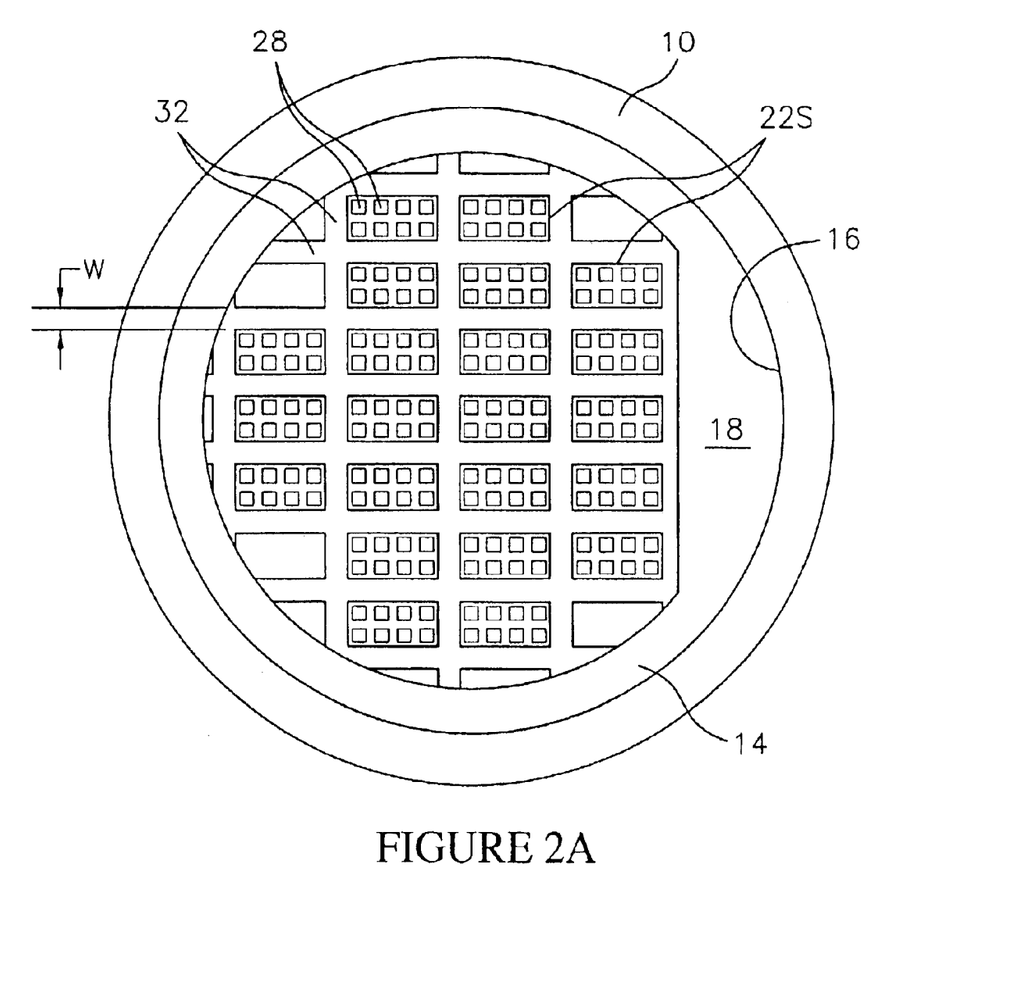
FIG. 2A is a plan view, with parts removed, taken along line 2A—2A of FIG. 2, illustrating the diced components.

Referring to FIGS. 2 and 2A, a dicing step of the method is illustrated. During the dicing step the component substrate 12 is separated into a plurality of singulated components 22S. In the illustrative embodiment the dicing step is performed using a sawing process. However, it is to be understood that the method can be practiced using other dicing processes such as scribing, etching or cutting with a pressurized fluid.

As shown in FIG. 2, during the dicing step a rotating saw blade 30 cuts through the component substrate 12, and part way through the dicing tape 14. During the dicing step the dicing tape 14 supports the component substrate 12 and the singulated components 22S as well. In addition, the saw blade 30 is configured to cut the component substrate 12 without touching the support member 10. The dicing step can be performed using conventional equipment and techniques.

As shown in FIG. 2A, following the dicing step, the singulated components 22S remain on the dicing tape 14. In addition, a plurality of spaces 32 separate the singulated components 22S. The spaces 32 correspond to the saw cuts which are oriented either generally parallel or orthogonal to one another, along vertical and horizontal axes. With the component substrate 12 comprising a semiconductor wafer the spaces 32 can correspond to the "streets" on the wafer. A width W of the spaces 32 can correspond to a thickness of the saw blade 30.

Figure 3:
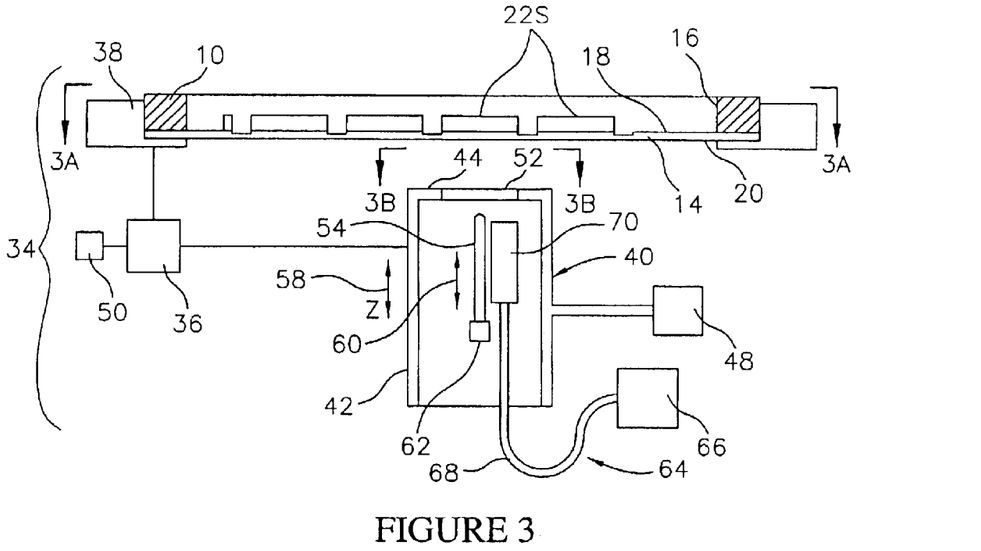
FIG. 3 is a schematic cross sectional view illustrating a system constructed in accordance with the invention configured to perform local radiation curing of the dicing tape.
Figure 3A:
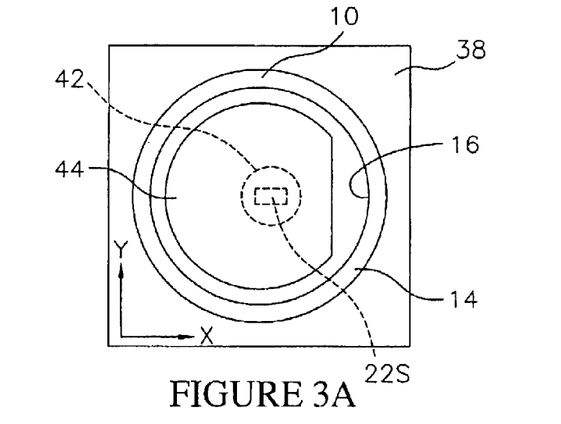
FIG. 3A is a reduced plan view taken along line 3A—3A of FIG. 3, illustrating a stepper mechanism of the system configured to step the component substrate in x and y directions.
Figure 3B:
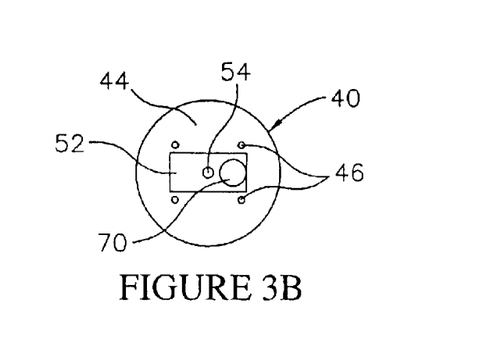
FIG. 3B is an enlarged plan view taken along line 3B—3B of FIG. 3 illustrating a component attach mechanism of the system.

Referring to FIGS. 3–3B, a system 34 for performing further steps in the method of the invention is illustrated. The system 34 includes the support member 10, and the dicing tape 14 configured substantially as previously described. The system 34 also includes a component attach system 36 which is illustrated schematically as a block. In the illustrative embodiment, the component attach system 36 comprises a die attacher modified to perform a radiation curing step during the attachment process. Die attachers are commercially available from ESC Manufacturing Company, of Warrington, Pa. as well as other manufacturers. One suitable die attacher is designated an ESC "9200" die attach system, and is configured to attach singulated dice or packages to leadframes.

The component attach system 36 includes a stepper mechanism 38 configured to hold the support member 10 and to step the support member 10 in x and y directions. The stepper mechanism 38 precisely moves the support member 10 so that the singulated components 22S can be aligned for a component attach step to be hereinafter described. This type of stepper mechanism is also known as an x-y table. The component attach system 36 also includes a controller 50, such as a computer, for controlling the operation of the stepper mechanism 38, as well as other components to be hereinafter described.

Figure 5:
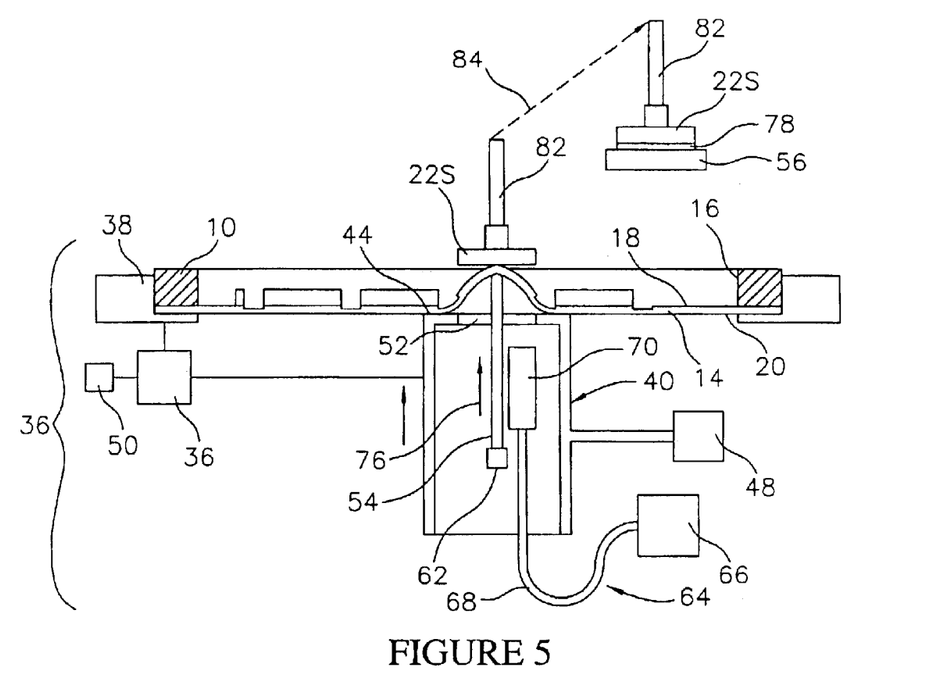
FIG. 5 is a schematic cross sectional view illustrating an ejector pin of the component attach mechanism pushing the singulated component as a pick and place mechanism grabs the component and places the component on a substrate.

The component attach system 36 also includes a component attach mechanism 40 configured to attach the singulated components 22S one at a time to a substrate 56 (FIG. 5). The component attach mechanism 40 includes a generally cylindrically shaped housing 42 moveable in both directions along the z axis as indicated by double headed arrow 58. A drive mechanism (not shown), such as a hydraulic or electric drive element, drives the housing 42 along the z-axis. The drive mechanism for the housing 42 can be in signal communication with, and controlled by the controller 50 for the component attach system 36.

The housing 42 includes a contact surface 44 configured to physically engage the backside surface 20 of the dicing tape 14. The contact surface 44 includes a plurality of vacuum openings 46 in flow communication with a vacuum source 48. The vacuum openings 46 direct a vacuum onto the backside surface 20 of the dicing tape 14, and hold the dicing tape 14 on the contact surface 44 during a component attach step to be hereinafter described. The contact surface 44 also includes an opening 52 having a peripheral outline that substantially matches a peripheral outline of a singulated component 22S. As shown in FIG. 3A, during a component attach step to be hereinafter described, the stepper mechanism 38 steps the support member 10 such that a singulated component 22S aligns with the opening 52 in the housing 42.

The component attach mechanism 40 also includes an ejector pin 54 configured to push the singulated components 22S from the dicing tape 14. The ejector pin 54 is moveable by a drive mechanism 62 in both directions along the z axis as indicated by double headed arrow 60. The drive mechanism 62 can comprise a hydraulic or electric drive in signal communication with the controller 50. The component attach mechanism 40 also include a vacuum pick and place mechanism 82 (FIG. 5) configured to pick up the singulated components 22S as they are being pushed by the ejector pin 54, and then to place the singulated components 22S on the substrate 56 (FIG. 5).

The component attach mechanism 40 also includes a radiation exposure assembly 64. The radiation exposure assembly 64 includes a radiation source 66, a flexible fiber optic cable 68, and a lens 70. During a radiation cure step to be hereinafter described, the radiation exposure assembly 64 is configured to direct the radiation through the opening 52 in the housing 42, and onto the backside surface 20 of the dicing tape 14. The radiation exposure assembly 64 can be constructed from commercially available components and can be in signal communication with the controller 50. In addition, the radiation source 66 can comprise a ultraviolet, infrared, thermal or radioactive source of radiation having a power selected as required.

Figure 4:
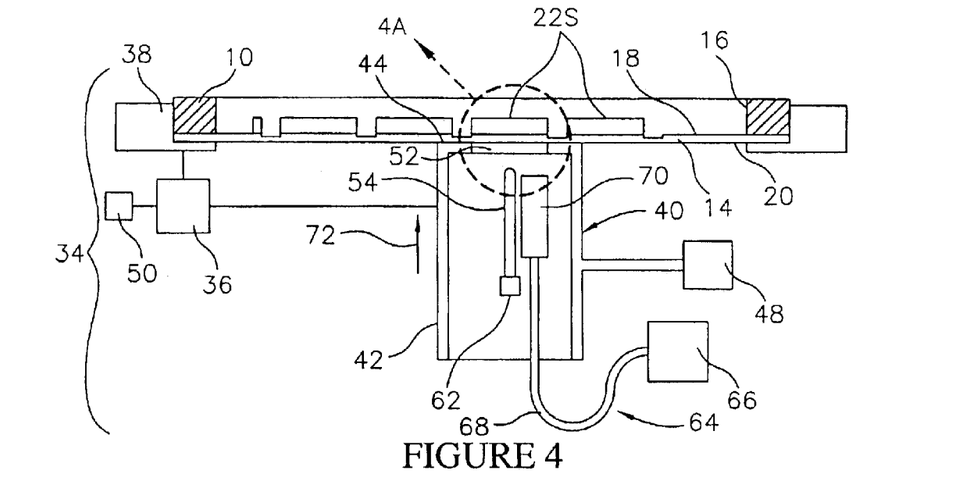
FIG. 4 is a schematic cross sectional view illustrating the component attach mechanism engaging the dicing tape proximate to a singulated component.
Figure 4A:
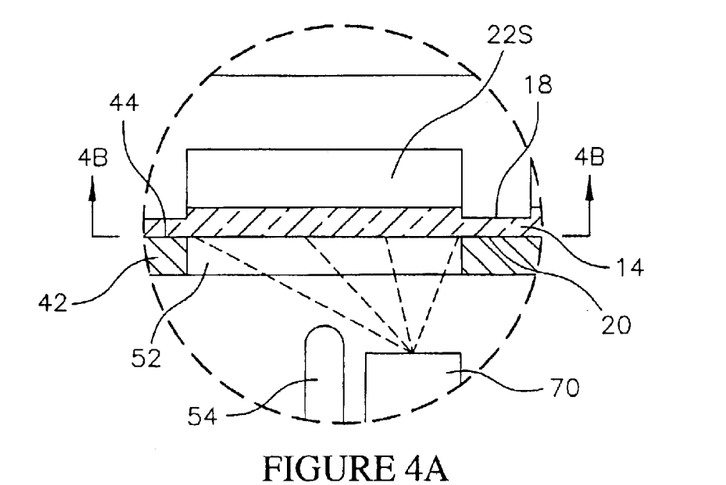
FIG. 4A is an enlarged portion of FIG. 4 illustrating a lens component of the system during local radiation curing of the dicing tape proximate to the singulated component.
Figure 4B:
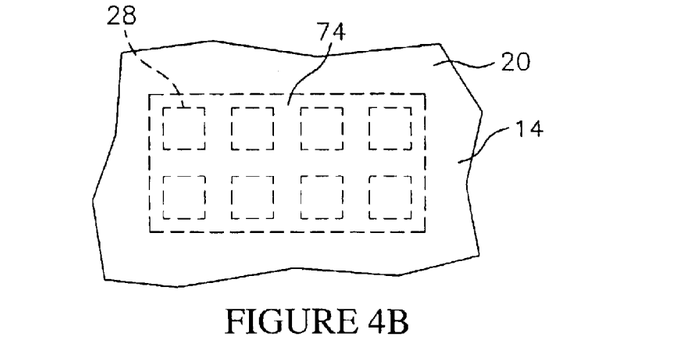
FIG. 4B is a cross sectional view taken along section line 4B—4B of FIG. 4A illustrating a local radiation cured portion of the dicing tape.

Referring to FIGS. 4–4B, a radiation exposure step performed using the system 34 is illustrated. Initially, as shown in FIG. 4, the housing 42 of the component attach mechanism 40 is moved in the z direction as indicated by arrow 72, such that the contact surface 44 on the housing 42 physically engages the backside surface 20 of the dicing tape 14. In addition, the opening 52 in the housing 42 aligns with the singulated component 22S. With the contact surface 44 in contact with the backside surface 20 of the dicing tape 14, the vacuum source 48 is actuated to direct a vacuum through the vacuum openings 46 (FIG. 3B) to hold the dicing tape 14 on the contact surface 44.

Next, as shown in FIG. 4A, the radiation source 66 is actuated to direct the radiation along the fiber optic cable 68, out of the lens 70 and through the opening 52 onto the backside surface 20 of the dicing tape 14. A duration of the radiation exposure step can be selected as required.

As shown in FIG. 4B, an exposed area 74 on the adhesive surface 18 of the dicing tape 14 has an outline corresponding to an outline of the opening 52. In addition, the outline of the exposed area 74 corresponds to the outline of the singulated component 22S. The dicing tape 14 is thus referred to as being "locally cured", as only the exposed area 74 proximate to the singulated component 22S has been radiation cured. The remainder of the dicing tape 14 has not been exposed to the radiation, such that is it not cured and remains adhesive or "tacky".

Referring to FIG. 5, a component attach step performed using the system 36 is illustrated. During the component attach step the substrate 56 having an adhesive member 78 already attached thereto, is placed proximate to the singulated component 22S. The adhesive member 78 can comprise cut decals of double sided tape, or can comprise a polymer deposited in viscous form and then cured. In addition, a mechanism for attaching the adhesive member 78 to the substrate 56 can be an element of the component attach system 36. One suitable mechanism for attaching the adhesive member 78 is disclosed in U.S. Pat. No. 6,012,502 to VanNortwick et al., which is incorporated herein by reference.

Also during the component attach step, the ejector pin 54 is actuated to move in the z direction as indicated by arrow 76. This pushes the singulated component 22S from the exposed area 74 of the dicing tape 14 onto the pick and place mechanism 82. The pick and place mechanism 82 is configured to pick (i.e., grab) the singulated component 22S using appropriate movement and a vacuum, and then to place the singulated component 22S on the substrate 56. As shown in FIG. 5, during the component attach step the dicing tape 14 "tents", but is not penetrated by the ejector pin 54. The vacuum openings 46 holds portions of the dicing tape 14 proximate to the radiation exposed area 74 (FIG. 4B) on the contact surface 44, and facilitate tenting of the dicing tape 14. Also, because the dicing tape 14 has reduced adhesion in the radiation exposed area 74 (FIG. 4B), the ejector pin 54 is able to more easily separate the singulated component 22S from the dicing tape 14. As also shown in FIG. 5 the pick and place mechanism 82 moves the singulated component 22S as indicated by arrow 84, and pushes the singulated component 22S against the adhesive member 78 and onto the substrate 56.

Figure 6:
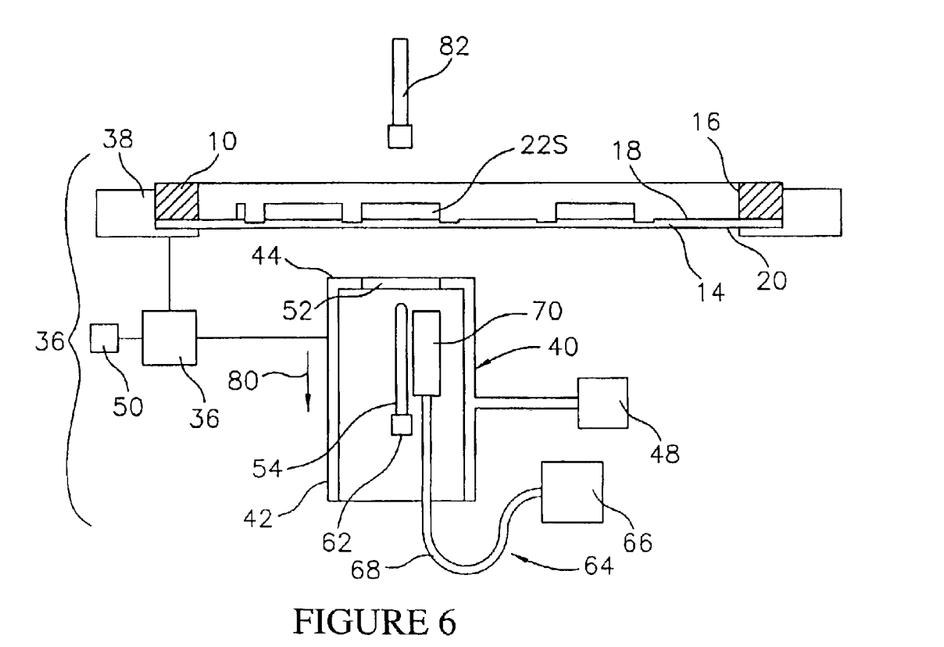
FIG. 6 is a schematic cross sectional view illustrating another singulated component positioned over the component attach mechanism.

Referring to FIG. 6, following the component attach step, the housing 42 is moved in the z direction as indicated by arrow 80, such that the contact surface 44 disengages the backside surface 20 of the dicing tape 14. In addition, the stepper mechanism 38 is actuated such that another singulated component 22S aligns with the component attach mechanism 40.

The steps in the method are then repeated substantially as previously described on all of the singulated components 22S that have been selected for attachment to the substrate 56. However, the singulated components 22S that have not been selected for attachment to the substrate 56 remain attached to the dicing tape 14, as the dicing tape 14 has not been cured in the areas adjacent to these singulated components 22S. This facilitates transport of these singulated components 22S on the dicing tape 14 for further processing.

Thus the invention provides an improved method and system for attaching semiconductor components to substrates. Although the invention has been described with reference to certain preferred embodiments, as will be apparent to those skilled in the art, certain changes and modifications can be made without departing from the scope of the invention as defined by the following claims.

I claim:

1. A method for attaching a semiconductor component to a substrate comprising:

providing the component and the substrate, the component comprising a semiconductor die or a semiconductor package, the substrate comprising a leadframe;

placing the component on a radiation sensitive tape;

providing a component attach system configured to attach the component to the substrate, the component attach system comprising a component attach mechanism and a radiation exposure assembly configured to expose the tape to a radiation;

exposing the tape using the radiation exposure assembly; and attaching the component to the substrate using the component attach mechanism.

2. The method of claim 1 wherein the component attach system comprises an element of a die attacher.

3. The method of claim 1 wherein the tape is attached to a support mechanism comprising a frame.

4. The method of claim 1 wherein the component attach mechanism includes a surface having an opening therein and the tape physically engages the surface prior to the exposing step.

5. A method for attaching a semiconductor component to a substrate comprising:

providing the component on a component substrate comprising a plurality of components, the component comprising a semiconductor die or a semiconductor package;

dicing the component substrate on a radiation sensitive tape to separate the component from the components;

providing a component attach system configured to adhesively attach the component to the substrate, the substrate comprising a leadframe, the component attach system comprising a contact surface configured to physically engage the tape and an opening in the surface having an outline substantially matching that of the component;

providing an exposure assembly in the component attach system configured to direct radiation through the opening onto an area of the tape;

engaging the contact surface with the tape;

exposing the tape by directing the radiation through opening using the exposure assembly; and attaching the component to the substrate using the component attach system.

6. The method of claim 5 wherein the component attach system comprises an element of a die attacher.

7. The method of claim 5 wherein the component substrate comprises a semiconductor wafer, a portion of a semiconductor wafer, or a panel.

8. A method for attaching semiconductor components to a substrate comprising:

providing a component substrate containing the components;

dicing the component substrate on a UV sensitive tape to separate a singulated component;

providing a component attach system configured to adhesively attach the component to the substrate, the component attach system comprising an opening, a pin configured to move through the opening and to push the singulated component from the tape, and a pick and place mechanism configured to place the singulated component on the substrate;

providing a source of a radiation on the component attach system configured to direct the radiation through the opening onto an area of the tape proximate to the singulated component;

exposing the area to the radiation using the source;

moving the pin through the opening to push the singulated component from the area; and attaching the component to the substrate using the component attach system.

9. The method of claim 8 further comprising following the attaching step, transporting the components on the tape.

10. The method of claim 8 wherein the component comprises a die or a package, and the substrate comprises a leadframe.

11. The method of claim 8 wherein the component attach system comprises an element of a die attacher.

12. The method of claim 8 wherein the tape is attached to a support mechanism comprising a frame.

13. A method for attaching a semiconductor component to a substrate comprising:

placing the component on a radiation sensitive tape;

providing a component attach system configured to adhesively attach the component to the substrate;

providing a radiation exposure assembly on the component attach system configured to expose an area of the tape to a radiation, the radiation exposure assembly comprising a fiber optic cable for transmitting the radiation;

exposing the tape in the area using the radiation exposure assembly; and attaching the component to the substrate using the component attach system.

14. The method of claim 13 further comprising engaging the tape with a surface of the component attach system during the placing the component on the substrate step.

15. The method of claim 13 wherein the component attach system comprises an element of a die attacher.

16. The method of claim 13 wherein the tape is attached a frame.

17. A method for attaching a semiconductor component to a substrate comprising:

providing the component on a component substrate comprising a plurality of components;

dicing the component substrate on a radiation sensitive tape to separate the component from the components;

providing a component attach system configured to attach the component to the substrate;

providing an exposure assembly on the component attach system comprising a fiber optic cable configured to direct radiation onto an area of the tape;

exposing the tape in the area using the exposure assembly; and attaching the component to the substrate using the component attach system.

18. The method of claim 17 wherein the component attach system comprises an element of a die attacher.

19. The method of claim 17 wherein the radiation comprises ultraviolet radiation, infrared radiation, thermal radiation, or radioactive radiation.

20. The method of claim 17 wherein the tape is attached to a holder configured to hold a component substrate containing the components for dicing.

21. The method of claim 17 wherein the tape is attached a frame.

* * * * *

UNITED STATES PATENT AND TRADEMARK OFFICE
CERTIFICATE OF CORRECTION

| | |
|---|---|
| PATENT NO. | : 6,943,094 B2 |
| DATED | : September 13, 2005 |
| INVENTOR(S) | : Michel Koopmans |

It is certified that error appears in the above-identified patent and that said Letters Patent is hereby corrected as shown below:

Column 8,
Lines 49-50, after "through" add -- the --.

Column 10,
Lines 8 and 33, after "attached" add -- to --.

Signed and Sealed this

Eighth Day of November, 2005

JON W. DUDAS
*Director of the United States Patent and Trademark Office*